United States Patent
Hou et al.

(10) Patent No.: US 10,756,770 B2
(45) Date of Patent: Aug. 25, 2020

(54) WIRELESS RADIO FREQUENCY COMMUNICATION SYSTEM

(71) Applicant: Contemporary Amperex Technology Co., Limited, Ningde, Fujian (CN)

(72) Inventors: Yizhen Hou, Ningde (CN); Zhimin Dan, Ningde (CN); Wei Zhang, Ningde (CN); Jiechao Luo, Ningde (CN); Wenbin Lu, Ningde (CN); Jia Xu, Ningde (CN); Teng Yu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 16/542,401

(22) Filed: Aug. 16, 2019

(65) Prior Publication Data

US 2020/0083917 A1 Mar. 12, 2020

(30) Foreign Application Priority Data

Sep. 12, 2018 (CN) .......................... 2018 1 1062691

(51) Int. Cl.
*H04B 1/04* (2006.01)
*H04B 1/00* (2006.01)
(Continued)

(52) U.S. Cl.
CPC .......... *H04B 1/0483* (2013.01); *H01Q 1/526* (2013.01); *H03H 7/0115* (2013.01);
(Continued)

(58) Field of Classification Search
CPC .. H04B 1/0483; H04B 1/0025; H04B 1/0078; H04B 1/1018; H01Q 1/526; H03H 7/0115
(Continued)

(56) References Cited

U.S. PATENT DOCUMENTS 7,650,122 B2 * 1/2010 Itkin .................... H03G 3/3042
455/126
7,742,751 B2 * 6/2010 Chiu ........................ H04B 1/30
455/307
(Continued)

FOREIGN PATENT DOCUMENTS

CN 103546176 A 1/2014
CN 104836580 A 8/2015
(Continued)

OTHER PUBLICATIONS

The extended European search report for European Application No. 19192895.1, dated Jan. 20, 2020, 8 pages.

*Primary Examiner* — Sonny Trinh
(74) *Attorney, Agent, or Firm* — Law Offices of Liaoteng Wang

(57) ABSTRACT

A system comprises an antenna, a port converting device, an information transmission device, a shield case, and a reference voltage end; wherein the antenna, the port converting device, and the information transmission device are connected sequentially, and the information transmission device is disposed within the shield case, and both the shield case and the port converting device is connected with the reference voltage end; the antenna is configured for a conversion between a radio frequency signal and a single-ended signal; the port converting device is configured for a conversion between the single-ended signal and target differential mode signals; the information transmission device is configured to transmit and process the target differential mode signals; and parameters of components in the port converting device is determined according to a preset communication frequency and a voltage amplitude and phase of a differential mode signal.

13 Claims, 5 Drawing Sheets

(51) Int. Cl.
*H03H 7/01* (2006.01)
*H01Q 1/52* (2006.01)
*H04B 1/10* (2006.01)

(52) U.S. Cl.
CPC ......... *H04B 1/0025* (2013.01); *H04B 1/0078* (2013.01); *H04B 1/1018* (2013.01)

(58) Field of Classification Search
USPC ...................................................... 455/127.1
See application file for complete search history.

(56) References Cited

U.S. PATENT DOCUMENTS

| | | | |
|---|---|---|---|
| 8,306,494 B2 | 11/2012 | Ojo | |
| 8,509,715 B2* | 8/2013 | Kanno | H03F 1/0222 |
| | | | 455/127.1 |
| 2010/0074303 A1* | 3/2010 | Tanaka | H04B 1/713 |
| | | | 375/133 |
| 2011/0014880 A1* | 1/2011 | Nicolson | G01S 7/032 |
| | | | 455/86 |
| 2011/0026509 A1* | 2/2011 | Tanaka | H04B 1/713 |
| | | | 370/338 |

FOREIGN PATENT DOCUMENTS

| | | | |
|---|---|---|---|
| CN | 104980924 A | 10/2015 | |
| CN | 105099475 A | 11/2015 | |
| EP | 0634891 A1 | 1/1995 | |
| EP | 2728759 A1 | 5/2014 | |
| WO | 9926309 A1 | 5/1999 | |

* cited by examiner

WIRELESS RADIO FREQUENCY COMMUNICATION SYSTEM

CROSS-REFERENCE TO RELATED APPLICATION

This application is based on and claims priority to Chinese Patent Application No. 201811062691.2 filed on Sep. 12, 2018, which is incorporated herein by reference in its entirety.

TECHNICAL FIELD

The present application relates to the field of communication, and more particularly to a wireless radio frequency communication system.

BACKGROUND

With the development of wireless radio frequency communication technology, people have raised more and more requirements for the transmission performance of wireless radio frequency communication systems. However, in the current wireless radio frequency communications, a receiver in the wireless radio frequency communication system may not be able to receive or completely demodulate the signal due to external interferences, thereby causing poor reception performance of the wireless radio frequency communication. Moreover, due to external interferences, a transmitter in the wireless radio frequency communication system may transmit the signal to other channels or to the frequency bands used by other systems, thereby causing poor transmission performance of the wireless radio frequency communication.

Therefore, it is an urgent problem to be solved to how to reduce external interferences to improve the transmission performance of wireless radio frequency communication systems.

SUMMARY

Embodiments of the present disclosure may provide a wireless radio frequency communication system.

According to an aspect of embodiments of the present disclosure, there is provided a wireless radio frequency communication system, comprising: an antenna, a port converting device, an information transmission device, a shield case, and a reference voltage end; wherein the antenna, the port converting device, and the information transmission device may be connected sequentially, and the information transmission device may be disposed within the shield case, and both the shield case and the port converting device may be connected with the reference voltage end;

the antenna may be configured for a conversion between a radio frequency signal and a single-ended signal;

the port converting device may be configured for a conversion between the single-ended signal and target differential mode signals;

the information transmission device may be configured to transmit and process the target differential mode signals;

parameters of components in the port converting device may be determined according to a preset communication frequency and a voltage amplitude and phase of a differential mode signal.

In one embodiment, the port converting device may comprise a first inductor $L_1$, a second inductor $L_2$, a first capacitor $C_1$, and a second capacitor $C_2$; wherein a first end of the first inductor $L_1$ may be connected with a first end of the second capacitor $C_2$, a second end of the first inductor $L_1$ may be connected with a first end of the first capacitor $C_1$, a second end of the second capacitor $C_2$ may be connected with a first end of the second inductor $L_2$, and a second end of the first capacitor $C_1$ and a second end of the second inductor $L_2$ may be connected with the reference voltage end;

an inductance value of the first inductor $L_1$, an inductance value of the second inductor $L_2$, an capacitance value of the first capacitor $C_1$, and an capacitance value of the second capacitor $C_2$ may be determined according to a voltage amplitude and phase of an output signal of the second end of the first inductor $L_1$, as well as a voltage amplitude and phase of an output signal of the second end of the second capacitor $C_2$.

In one embodiment, the port converting device may comprise a first LC serial-parallel network $T_1$, a second LC serial-parallel network $T_2$, a third LC serial-parallel network $T_3$, and a fourth LC serial-parallel network $T_4$; wherein a first end of $T_1$ may be connected with a first end of $T_2$, a second end of $T_1$ may be connected with a first end of $T_3$, a second end of $T_2$ may be connected with a first end of $T_4$, a second end of $T_3$ and a second end of $T_4$ may be connected with the reference voltage end;

$T_1$ may comprise at least one third inductor, and $T_2$ may comprise at least one third capacitor;

$T_3$ may comprise at least one fourth capacitor, and $T_4$ may comprise at least one fourth inductor.

In one embodiment, the shield case may be a metal case.

In one embodiment, the wireless radio frequency communication system may further comprise: a pre-stage filtering device;

a first end of the pre-stage filtering device may be connected with the antenna, and a second end of the pre-stage filtering device may be connected with the port converting device;

the pre-stage filtering device may be configured to filter the single-ended signal.

In one embodiment, the information transmission device may comprise a transmitting module and a receiving module;

the receiving module may be connected with the port converting device, and configured to receive a first differential mode signal of the target differential mode signals from the port converting device and convert the first differential mode signal into a first baseband signal;

the transmitting module may be connected with the port converting device, and configured to receive a second baseband signal, convert the second baseband signal into a second differential mode signal of the target differential mode signals, and input the second differential mode signal to the port converting device.

In one embodiment, the wireless radio frequency communication system may further comprise: a radio frequency controller connected with the information transmission device;

the radio frequency controller may be configured to output the second baseband signal and control the transmitting module to output the second differential mode signal;

the radio frequency controller may be further configured to receive the first baseband signal and control the receiving module to receive the first differential mode signal.

In one embodiment, the receiving module may comprise: a post-stage filtering sub-module, a low-noise amplifying sub-module, a demodulating sub-module, and a demodulation reference frequency signal generating sub-module, that may be connected sequentially, a first end of the post-stage filtering sub-module may be connected with the port converting device, a second end of the post-stage filtering sub-module may be connected with a first end of the low-noise amplifying sub-module, a second end of the low-noise amplifying sub-module may be connected with a first end of the demodulating sub-module, and a second end of the demodulating sub-module may be connected with the radio frequency controller;

the post-stage filtering sub-module may be configured to filter the first differential mode signal;

the low-noise amplifying sub-module may be configured to perform a signal amplification on the filtered first differential mode signal to obtain a first amplified differential mode signal;

the demodulating sub-module may be configured to demodulate the first amplified differential mode signal based on the received demodulation reference frequency signal to obtain the first baseband signal;

the demodulation reference frequency signal generating sub-module may be configured to generate the demodulation reference frequency signal.

In one embodiment, the demodulation reference frequency signal generating sub-module may comprise: a local oscillation signal generating unit, a first phase detecting unit, a first voltage-controlled oscillating unit, and a first frequency sampling unit; wherein the local oscillation signal generating unit may be connected with a first end of the first phase detecting unit, a second end of the first phase detecting unit may be connected with a first end of the first voltage-controlled oscillating unit, a second end of the first voltage-controlled oscillating unit may be connected with the demodulating sub-module, a first end of the first frequency sampling unit may be connected with the first phase detecting unit, and a second end of the first frequency sampling unit may be connected with a second end of the first voltage-controlled oscillating unit;

the first phase detecting unit may be configured to receive a local oscillation frequency signal from the local oscillation signal generating unit and a first oscillation frequency signal from the first frequency sampling unit, determine a first phase difference between the local oscillation frequency signal and the first oscillation frequency signal, and output a first voltage signal corresponding to the first phase difference;

the first phase detecting unit may be further configured to determine whether the first phase difference satisfies a first stable condition, wherein the first stable condition may be that a number of consecutive occurrences of the first phase difference within a first preset phase difference threshold range reaches a first preset number threshold;

if the first stable condition is satisfied, the first phase detecting unit may be configured to keep the first voltage signal unchanged, so that the first voltage-controlled oscillating unit may output the demodulation reference frequency signal with a fixed frequency according to the first voltage signal;

if the first stable condition is not satisfied, the first phase detecting unit may be configured to receive a new first oscillation frequency signal from the first frequency sampling unit and the local oscillation frequency signal, determine a phase difference between the new first oscillation frequency signal and the local oscillation frequency signal, and use the phase difference between the new first oscillation frequency signal and the local oscillation frequency signal as the first phase difference, wherein the new first oscillation frequency signal may be a signal corresponding to the first voltage signal output by the first voltage-controlled oscillating unit.

In one embodiment, the transmitting module may comprise a modulating sub-module, a phase locking sub-module, and a power amplifying sub-module;

a first end of the modulating sub-module may be connected with the radio frequency controller, a second end of the modulating sub-module may be connected with a first end of the phase locking sub-module, a second end of the phase locking sub-module may be connected with a first end of the power amplifying sub-module, a second end of the power amplifying sub-module may be connected with the port converting device; wherein the modulating sub-module may be configured to modulate the second baseband signal to obtain a modulated signal;

the phase locking sub-module may be configured to adjust a frequency of the modulated signal to obtain a target frequency signal;

the power amplifying sub-module may be configured to amplify a power of the target frequency signal to obtain the second differential mode signal.

In one embodiment, the phase locking sub-module may comprise a second phase detecting unit, a second voltage-controlled oscillating unit, and a second frequency sampling unit;

a first end of the second phase detecting unit may be connected with the modulating sub-module, a second end of the second phase detecting unit may be connected with a first end of the second voltage-controlled oscillating unit, a second end of the second voltage-controlled oscillating unit may be connected with the power amplifying sub-module, a first end of the second frequency sampling unit may be connected with the second phase detecting unit, a the second end of the second frequency sampling unit may be connected with a second end of the second voltage-controlled oscillating unit;

the second phase detecting unit may be configured to receive the modulated signal from the modulating sub-module and a second oscillation frequency signal from the second frequency sampling unit, determine a second phase difference between the modulated signal and the second oscillation frequency signal, and output a second voltage signal corresponding to the second phase difference;

the second phase detecting unit may be further configured to determine whether the second phase difference satisfies a second stable condition, and the second stable condition may be that a number of consecutive occurrences of the second phase difference within a second preset phase difference threshold range reaches a second preset number threshold;

if the second stable condition is satisfied, the second phase detecting unit may be configured to keep the second voltage signal unchanged, so that the second voltage-controlled oscillating unit may output the target frequency signal with a fixed frequency according to the second voltage signal;

if the second stable condition is not satisfied, the second phase detecting unit may be configured to receive a new second oscillation frequency signal from the second frequency sampling unit and the modulated signal, determine a phase difference between the new second oscillation frequency signal and the modulated signal, and use the phase difference between the new second oscillation frequency signal and the modulated signal as the second phase difference, wherein the new second oscillation frequency signal may be a signal corresponding to the second voltage signal output by the second voltage-controlled oscillating unit.

In one embodiment, the phase locking sub-module may further comprise a first post-stage filtering unit;

a first end of the first post-stage filtering unit may be connected with a second end of the second phase detecting unit, a second end of the first post-stage filtering unit may be connected with a first end of the second voltage-controlled oscillating unit;

the first post-stage filtering unit may be configured to filter the second voltage signal, and input the filtered second voltage signal to the second voltage-controlled oscillating unit.

In one embodiment, the transmitting module may further comprise a power controlling sub-module and a power sampling sub-module;

a first end of the power controlling sub-module may be connected with the power amplifying sub-module, a second end of the power controlling sub-module may be connected with a first end of the power sampling sub-module, a second end of the power sampling sub-module may be connected with the second end of the power amplifying sub-module;

the power controlling sub-module may be configured to receive, via the power sampling sub-module, a power amplified signal from the power amplifying sub-module, and determine whether a difference between a preset power and a power of the power amplified signal belongs to a preset power threshold range;

if the difference belongs to the preset power threshold range, the power controlling sub-module may output a first gain controlling signal, so that the power amplifying sub-module may output the second differential mode signal according to the first gain controlling signal;

if the difference does not belong to the preset power threshold range, the power controlling sub-module may be configured to output a second gain controlling signal, so that the power amplifying sub-module may output a new power amplified signal according to the second gain controlling signal.

BRIEF DESCRIPTION OF THE DRAWINGS

In order to illustrate the technical solutions of embodiments of the present disclosure more clearly, the accompanying drawings used in embodiments of the present disclosure will be briefly described below, and for those skilled in the art, other drawings may be obtained from these drawings without any creative work.

DETAILED DESCRIPTION

Features and exemplary embodiments of various aspects of the present disclosure will be described in detail below, and to make the objects, technical solutions, and advantages of the present disclosure more clear, the present disclosure will be described in detail below with reference to the accompanying drawings and embodiments. It is understood that the specific embodiments described herein are only to be construed as illustrative and not limiting. For those skilled in the art, the present disclosure may be practiced without some of these specific details. The following descriptions of the embodiments are merely to provide a better understanding of the disclosure by way of examples.

It should be noted that, in this context, relationship terms such as first and second, etc., are used merely to distinguish one entity or operation from another, and do not necessarily require or imply any such actual relation or sequence among these entities or operations. Furthermore, the term "comprise" or "include" or any other variations thereof are intended to encompass a non-exclusive inclusion, such that a process, method, article, or device comprising a series of elements includes not only those elements, but also other elements that are not explicitly listed, or elements that are inherent to such a process, method, article, or device. An element defined by the phrase "comprising", without limiting the present disclosure, does not exclude the presence of additional same elements in the process, method, article, or device comprising the said elements.

The wireless radio frequency communication system according to embodiments of the present disclosure will be described in detail below with reference to the accompanying drawings.

Figure 1:
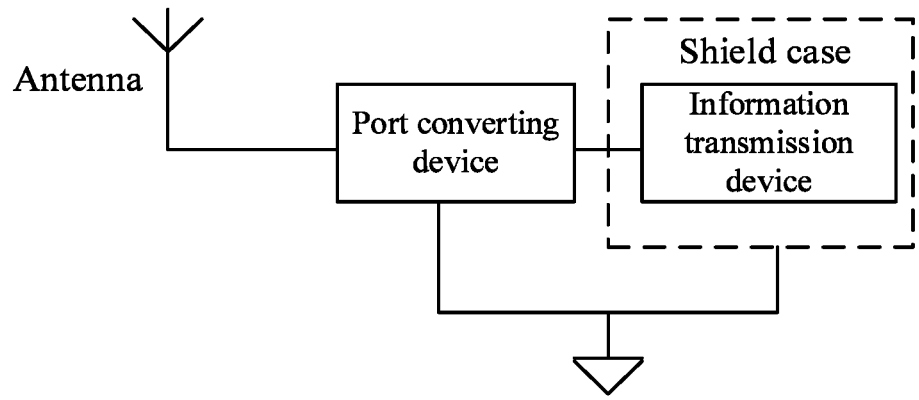
FIG. 1 shows a structural diagram of a wireless radio frequency communication system according to a first embodiment of the present disclosure.

FIG. 1 shows a structural diagram of a wireless radio frequency communication system according to one embodiment of the present disclosure. As shown in FIG. 1, the wireless radio frequency communication system may comprise an antenna, a port converting device, an information transmission device, a shield case, and a reference voltage end (GND).

In embodiments of the present disclosure, the antenna, the port converting device, and the information transmission device may be connected sequentially, and the information transmission device may be disposed within the shield case, and both the shield case and the port converting device may be connected with the reference voltage end.

And wherein, the antenna may be configured for a conversion between a radio frequency signal and a single-ended signal; the port converting device may be configured for a conversion between the single-ended signal and target differential mode signals; the information transmission device may be configured to transmit and process the target differential mode signals.

In embodiments of the present disclosure, the single-ended signal is relative to the differential mode signal, and the single-ended signal is a signal whose voltage measurement reference is ground. The differential mode signal transmits a level difference signal between the two signals, and the voltages of the two signals are equal in amplitude and opposite in phase.

When external interference occurs, the anti-interference of the single-ended signal may be poor due to the influence of the ground, while the influences of the external interference on the two signals in the differential mode signal may be almost equal, but the voltage difference between the two signals may not vary significantly, thus, the differential mode signal may have strong anti-interference ability in the process of transmitting information.

In embodiments of the present disclosure, the wireless radio frequency communication system may implement both the transmission and reception of information and therefore the target differential mode signals may comprise both the first differential mode signal output by the port converting device to the information transmission device, and the second differential mode signal input by the information transmission device to the port converting device.

In embodiments of the present disclosure, the parameters of components in the port converting device may be determined according to a preset communication frequency and a voltage amplitude and phase of the differential mode signal.

In embodiments of the present disclosure, determining the parameters of components in the port converting device based on the preset communication frequency and the voltage amplitude and phase of the differential mode signal, the conversion performance of the port converting device may be improved.

In embodiments of the present disclosure, the shield case may be a metal case. The material of the shield case may be an alloy, for example, an alloy material such as Copper-Nickel-Zinc Alloy, stainless steel or the like.

The wireless radio frequency communication system according to embodiments of the present disclosure, through converting the single-ended signal into an anti-interference differential mode signal by using the high-performance port converting device, and making the high-performance port converting device and the shield case disposed outside the information transmission device common-ground, may effectively reduce external interferences to the wireless radio frequency communication system and prevent the interference electromagnetic wave generated by the information transmission device diffusing outward.

Moreover, the ground of the shield case and the ground of the port converting device may be common-ground, on the one hand, the shield case and the components of the port converting device may share a potential reference point, thereby shielding the external interference to the radio frequency system and the interference of the radio frequency system to the outside; on the other hand, the heat dissipation area of the information transmission device may be increased, and the heat dissipation efficiency may be effectively improved.

The specific structure of the port converting device of embodiments of the present disclosure will be described in detail below by way of specific embodiments with reference to FIGS. 2 and 3.

Figure 2:
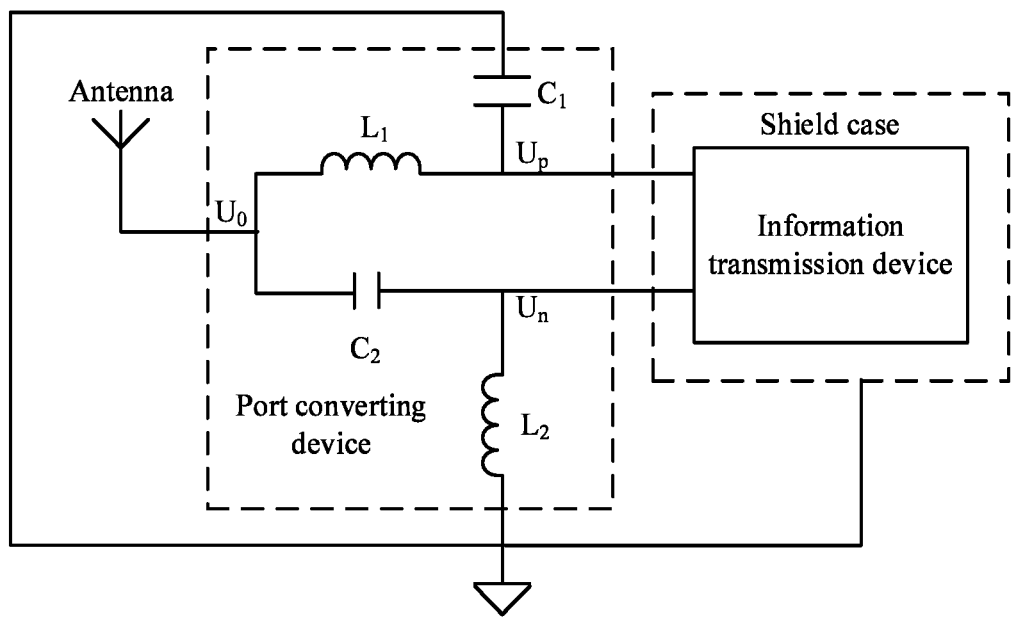
FIG. 2 shows a structural diagram of a wireless radio frequency communication system according to a second embodiment of the present disclosure.

FIG. 2 is a structural diagram of a wireless radio frequency communication system according to one exemplary embodiment of the present disclosure. FIG. 2 shows the specific structure of the port converting device.

As shown in FIG. 2, in one embodiment, the port converting device may comprise a first inductor $L_1$, a second inductor $L_2$, a first capacitor $C_1$, and a second capacitor $C_2$.

A first end of the first inductor $L_1$ may be connected with a first end of the second capacitor $C_2$, a second end of the first inductor $L_1$ may be connected with a first end of the first capacitor $C_1$, a second end of the second capacitor $C_2$ may be connected with a first end of the second inductor $L_2$, and a second end of the first capacitor $C_1$ and a second end of the second inductor $L_2$ may be connected with the reference voltage end.

Wherein, an inductance value of the first inductor $L_1$, an inductance value of the second inductor $L_2$, an capacitance value of the first capacitor $C_1$, and an capacitance value of the second capacitor $C_2$ may be determined according to a voltage amplitude and phase of an output signal of the second end of the first inductor $L_1$, as well as a voltage amplitude and phase of an output signal of the second end of the second capacitor $C_2$.

In one example, the preset communication frequency may be f, a voltage of the single-ended signal of the port converting device may be $U_0$, a voltage of the output signal of the second end of the first inductor $L_1$ may be $U_p$, and a voltage of the output signal of the second end of the second capacitor $C_2$ may be $U_n$. According to the circuit of the port converting device, the relationship of $U_0$, $U_p$ and $U_n$ may be expressed by the following two expressions:

$$U_p = U_0 * \frac{\frac{1}{jwC_1}}{jwL_1 + \frac{1}{jwC_1}} = \frac{U_0}{1 - w^2 L_1 C_1} \tag{1}$$

$$U_n = U_0 * \frac{jwL_2}{jwL_2 + \frac{1}{jwC_2}} = \frac{U_0 w^2 L_2 C_2}{w^2 L_2 C_2 - 1} \tag{2}$$

The output signals of the port converting device at the second end of the first inductor $L_1$ and at the second end of the second capacitor $C_2$ may be differential mode signals, that is, the amplitudes of the two output signals may be the same, while the phases of the two output signals may differ by 180 degrees, i.e., the phases are opposite. That is, the relationship between $U_p$ and $U_n$ may be represented by the following two expressions:

$$|U_p| = |U_n| \tag{3}$$

$$U_p = -U_n \tag{4}$$

Since w=2πf, combining the above expressions (1), (2), (3), and (4), a relationship of the inductance value of the first inductor $L_1$, the inductance value of the second inductor $L_2$, the capacitance value of the first capacitor $C_1$, and the capacitance value of the second capacitor $C_2$ may be solved as:

$$4\pi^2 f^2 L_1 C_1 + \frac{1}{4\pi^2 f^2 L_2 C_2} = 2 \tag{5}$$

In this example, the capacitance values and the inductance values in the port converting device may be set according to the above expression (5).

In one specific example, in order to facilitate the design of the port converting device, letting $L_1 = L_2 = L_0$, $C_1 = C_2 = C_0$. The following expression may be obtained under these conditions:

$$L_0 C_0 = \frac{1}{4\pi^2 f^2} \tag{6}$$

The wireless radio frequency communication system according to embodiments of the present disclosure, through setting the parameters of components in the port converting device based on the preset communication frequency and the voltage amplitude and phase of the differential mode signal, may improve the conversion precision of the single-ended signal and the differential mode signal, such that information may be transmitted with the high-precision differential mode signal in the wireless radio frequency communication system, thereby avoiding interference from the external environment.

Figure 3:
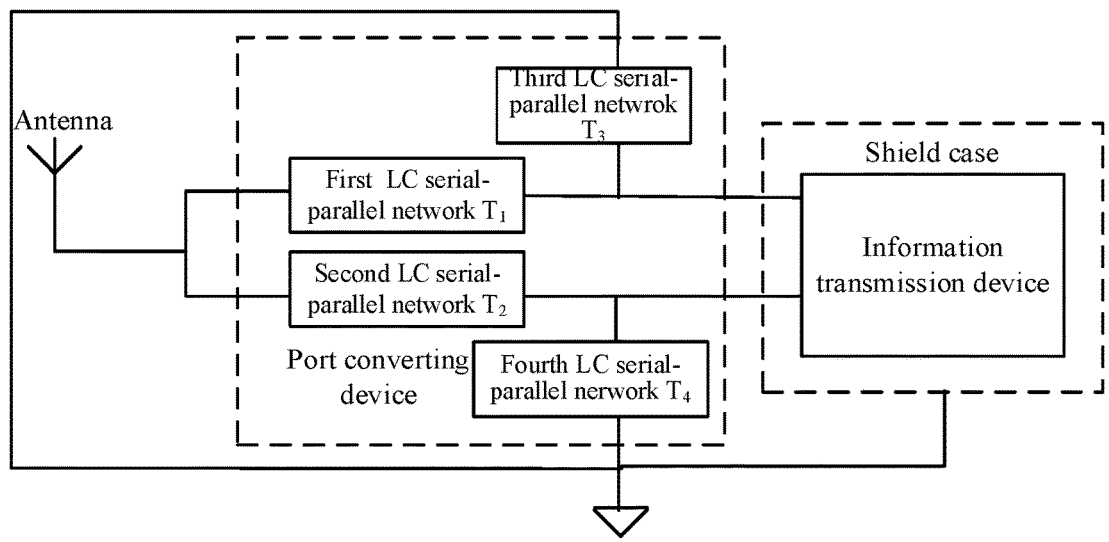
FIG. 3 shows a structural diagram of a wireless radio frequency communication system according to a third embodiment of the present disclosure.

FIG. 3 is a structural diagram of a wireless radio frequency communication system according to another exemplary embodiment of the present disclosure. FIG. 3 shows the specific structure of another port converting device.

As shown in FIG. 3, the port converting device may comprise a first LC serial-parallel network $T_1$, a second LC serial-parallel network $T_2$, a third LC serial-parallel network $T_3$, and a fourth LC serial-parallel network $T_4$.

Wherein, a first end of the first LC serial-parallel network $T_1$ may be connected with a first end of the second LC serial-parallel network $T_2$, a second end of $T_1$ may be connected with a first end of the third LC serial-parallel network $T_3$, a second end of the second LC serial-parallel network $T_2$ may be connected with a first end of the fourth LC serial-parallel network $T_4$, a second end of the third LC serial-parallel network $T_3$ and a second end of the fourth LC serial-parallel network $T_4$ may be connected with the reference voltage end.

And wherein, the first LC serial-parallel network $T_1$ may comprise at least one inductor, and the second LC serial-parallel network $T_2$ may comprise at least one capacitor; the third LC serial-parallel network $T_3$ may comprise at least one capacitor, and the fourth LC serial-parallel network $T_4$ may comprise at least one inductor.

In order to avoid the influence of stray inductance and capacitance on high frequency signals, the port converting device may be adjusted accordingly according to actual needs. Specifically, capacitors and/or inductors may be added or subtracted in the branch in which $L_1$ locates of FIG. 2 to form the first LC serial-parallel network, capacitors and/or inductors may be added or subtracted in the branch in which $C_2$ locates of FIG. 2 to form the second LC serial-parallel network, capacitors and/or inductors may be added or subtracted in the branch in which $C_1$ locates of FIG. 2 to form the third LC serial-parallel network, or capacitors and/or inductors may be added or subtracted in the branch in which $L_2$ locates of FIG. 2 to form the fourth LC serial-parallel network.

As to the relationship of the capacitance values and inductance values of the first LC serial-parallel network $T_1$, the second LC serial-parallel network $T_2$, the third LC serial-parallel network $T_3$, and the fourth LC serial-parallel network $T_4$, it may be obtained utilizing a similar manner with the determination method of that of the capacitance values and inductance values of the port converting device in FIG. 2, which will not be repeated herein.

Figure 4:
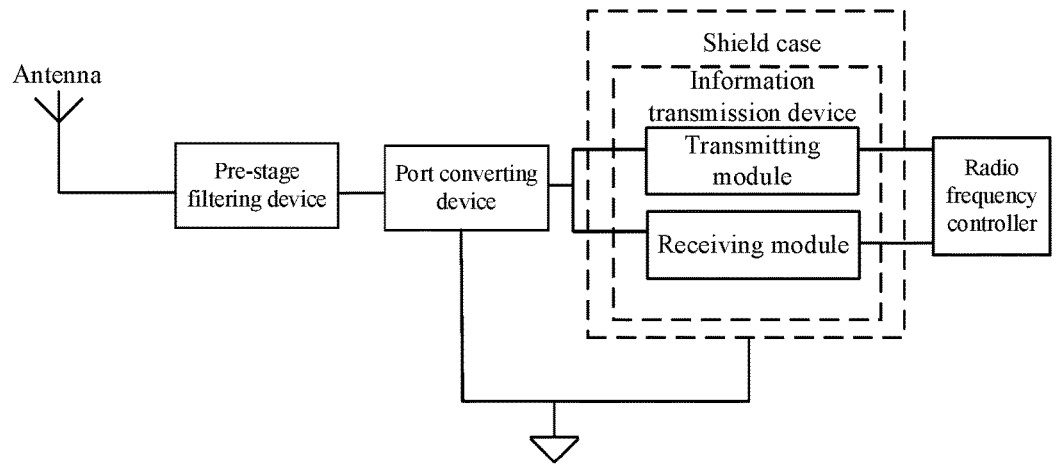
FIG. 4 shows a structural diagram of a wireless radio frequency communication system according to a fourth embodiment of the present disclosure.

FIG. 4 shows a structural diagram of a wireless radio frequency communication system according to another exemplary embodiment of the present disclosure. The wireless radio frequency communication system as shown in FIG. 4 may differ from the wireless radio frequency communication system as shown in FIG. 1 in that:

As shown in FIG. 4, the wireless radio frequency communication system may further comprise: a pre-stage filtering device and a radio frequency controller; the information transmission device may comprise: a transmitting module and a receiving module.

However, the present disclosure is not limited to the specific modules described above and shown in FIG. 4. In some embodiments, the wireless radio frequency communication system may comprise only some of the modules therein, that is, a more flexible module configurations, which will be described below in conjunction specific embodiments As shown in FIG. 4, in one embodiment of the present disclosure, the wireless radio frequency communication system may further comprise a pre-stage filtering device. A first end of the pre-stage filtering device may be connected with the antenna, and a second end of the pre-stage filtering device may be connected with the port converting device.

When the wireless radio frequency communication system receives information using the antenna, the pre-stage filtering device may be configured to filter the single-ended signal output by the antenna. The pre-stage filtering device may be able to filter out a portion of the interference signal of which the frequency is close to that of the useful signal, thereby improving the signal-to-noise ratio and reducing the spurious response. Wherein, the spurious response may refer to an interference signal, generated at the receiver, of which the frequency is close to that of the received useful signal and cannot be filtered by the wireless radio frequency communication system.

When the wireless radio frequency communication system transmits information using the antenna, the pre-stage filtering device may be configured to filter the single-ended signal output by the port converting device. The pre-stage filtering device may be able to filter the single-ended signal output by the port converting device to filter out interference signals, thereby reducing stray radiation. Wherein, the stray radiation may refer to a signal within a non-specified range generated by the transmitter during the transmission of a wireless signal.

The wireless radio frequency communication system according to embodiments of the present disclosure, through filtering the single-ended signal with the pre-stage filtering device, may remove interference signals, thereby reducing spurious responses or stray radiations.

Continue to referring to FIG. 4, in one embodiment of the present disclosure, the information transmission device may comprise a transmitting module and a receiving module.

The receiving module may be connected with the port converting device, and configured to, when the wireless radio frequency communication system receives information, receive a first differential mode signal from the port converting device and convert the first differential mode signal into a first baseband signal.

The transmitting module may be connected with the port converting device, and configured to, when the wireless radio frequency communication system transmits information, receive a second baseband signal, convert the second baseband signal into a second differential mode signal, and input the second differential mode signal to the port converting device.

In this embodiment, the transmitting and receiving of information by the wireless radio frequency communication system may be implemented by disposing the transmitting module and the receiving module in the information transmission device. Optionally, the information transmission device may also comprise only the receiving module or the transmitting module, which may be disposed according to specific practical application requirements, and is not specifically limited in embodiments of the present disclosure.

Continue to referring to FIG. 4, in one embodiment of the present disclosure, the wireless radio frequency communication system may further comprise a radio frequency controller.

Wherein, the radio frequency controller may be connected with the transmitting module of the information transmission device, and configured to output the second baseband signal and control the transmitting module to output the second differential mode signal.

The radio frequency controller may be further connected with the receiving module of the information transmission device, and configured to receive the first baseband signal and control the receiving module to receive the first differential mode signal.

In one embodiment, the port converting device may be connected with both the transmitting module and the receiving module. That is, the wireless radio frequency communication system may be able to transmit information to the outside through the transmitting module, and also receive information sent by the outside through the receiving module.

However, since the wireless radio frequency communication system may not be able to transmit and receive information simultaneously, the wireless radio frequency communication system may use the radio frequency controller to control the transmitting module and the receiving module to operate in different time slots. Specifically, by presetting time intervals in the radio frequency controller, the radio frequency controller may be able to control the transmitting module or the receiving module to operate alternately according to the preset time intervals. That is, the transmitting module or the receiving module may communicate with the port converting device alternately according to the preset time intervals.

In some embodiments of the present disclosure, at least one of the pre-stage filtering device, the port converting device, and the radio frequency controller may also be disposed in the shield case to further avoid external interference to the wireless radio frequency communication system.

Figure 5:
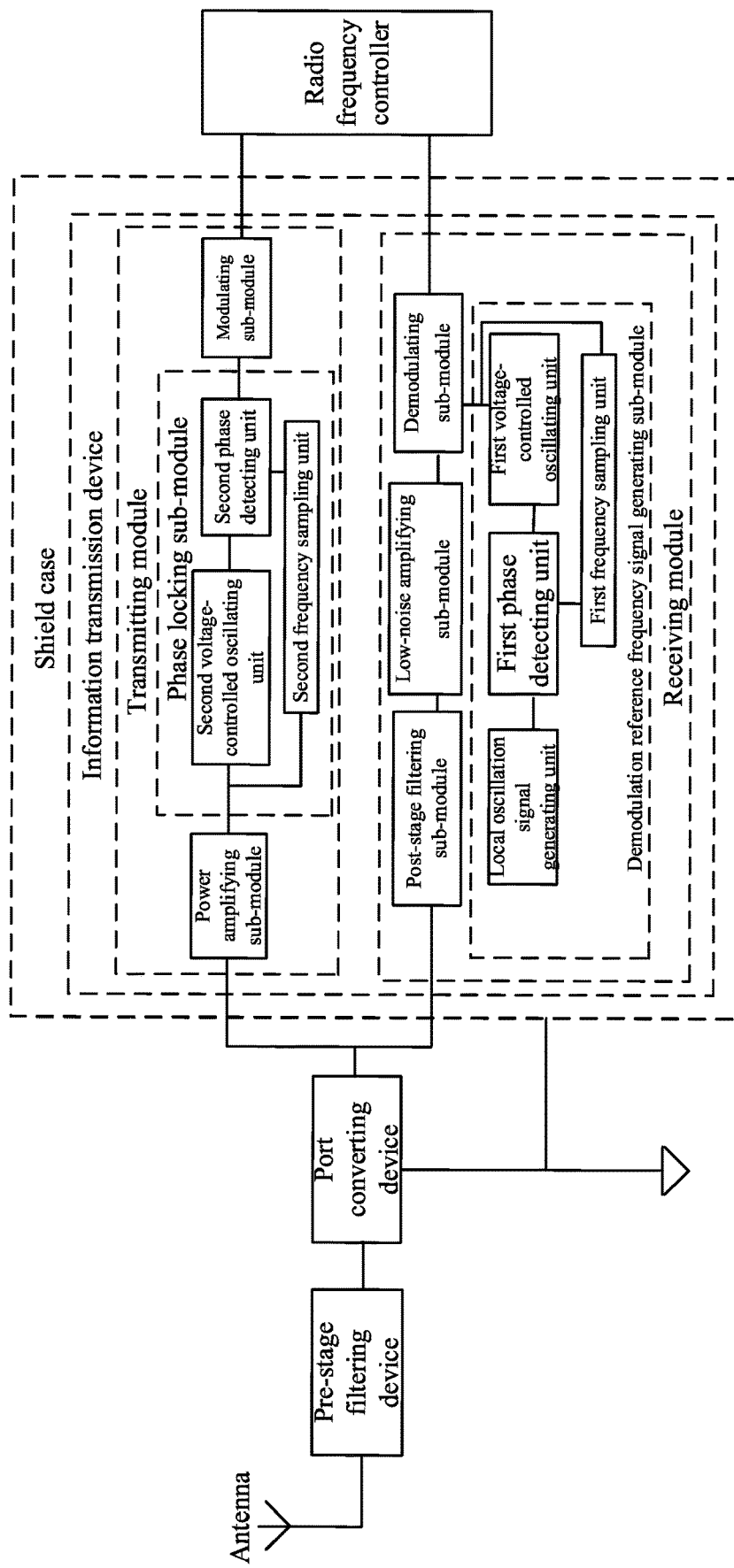
FIG. 5 shows a structural diagram of a wireless radio frequency communication system according to a fifth embodiment of the present disclosure.

FIG. 5 shows a structural diagram of a wireless radio frequency communication system according to yet another embodiment of the present disclosure. The wireless radio frequency communication system as shown in FIG. 5 may differ from the wireless radio frequency communication system as shown in FIG. 1 in that: FIG. 5 schematically shows the specific structure of the transmitting module and the receiving module.

As shown in FIG. 5, in one embodiment, the receiving module may comprise a post-stage filtering sub-module, a low-noise amplifying sub-module, a demodulating sub-module, and a demodulation reference frequency signal generating sub-module, that may be connected sequentially.

Wherein, a first end of the post-stage filtering sub-module may be connected with the port converting device, a second end of the post-stage filtering sub-module may be connected with the low-noise amplifying sub-module, a first end of the demodulating sub-module may be connected with the low-noise amplifying sub-module, and a second end of the demodulating sub-module may be connected with the radio frequency controller.

The post-stage filtering sub-module may be configured to filter the first differential mode signal output by the port converting device.

The low-noise amplifying sub-module may be connected with the post-stage filtering sub-module, and configured to perform signal amplification on the filtered first differential mode signal to obtain a first amplified differential mode signal.

The demodulating sub-module may be configured to demodulate the first amplified differential mode signal based on a demodulation reference frequency signal from the demodulation reference frequency signal generating sub-module to obtain the first baseband signal, and transmit the first baseband signal to the radio frequency controller.

The demodulation reference frequency signal generating sub-module may be configured to generate the demodulation reference frequency signal.

The wireless radio frequency communication system according to embodiment of the present disclosure, through performing a secondary filtering on the single-ended signal output by the port converting device using the post-stage filtering sub-module, may filter out interference signals, and use the low-noise amplifying sub-module to reduce the background noise of the wireless radio frequency communication system, thus interference signals may be filtered out effectively, thereby improving the signal-to-noise ratio and reducing spurious responses.

Continue to referring to FIG. 5, in some embodiments, the demodulation reference frequency signal generating sub-module may comprise: a local oscillation signal generating unit, a first phase detecting unit, a first voltage-controlled oscillating unit, and a first frequency sampling unit.

Wherein, the local oscillation signal generating unit may be connected with a first end of the first phase detecting unit, a second end of the first phase detecting unit may be connected with a first end of the first voltage-controlled oscillating unit, a second end of the first voltage-controlled oscillating unit may be connected with the demodulating sub-module, a first end of the first frequency sampling unit may be connected with the first phase detecting unit, and a second end of the first frequency sampling unit may be connected with a second end of the first voltage-controlled oscillating unit.

In one embodiment, the local oscillation signal generating unit may be a crystal oscillator.

In another embodiment, the local oscillation signal generating unit may comprise a crystal oscillator and a frequency synthesizing unit. The local oscillation signal generating unit in this embodiment may be used to avoid a situation in which the local oscillation frequency signal output by the crystal oscillator does not satisfy the actual demand. Wherein, the frequency synthesizing unit may be configured to receive a frequency signal output by the crystal oscillator, as well as a frequency matching clock signal, a frequency matching data signal and a frequency reset signal output by the radio frequency controller, and synthesize the frequency output by the crystal oscillator and the frequency output by the radio frequency controller to obtain a local oscillation frequency signal that satisfies the actual demand.

In one embodiment, the first phase detecting unit may be configured to receive a local oscillation frequency signal from the local oscillation signal generating unit and a first oscillation frequency signal from the first frequency sampling unit, determine a first phase difference between the local oscillation frequency signal and the first oscillation frequency signal, and output a first voltage signal corresponding to the first phase difference.

The first phase detecting unit may be further configured to determine whether the first phase difference satisfies a first stable condition, wherein the first stable condition may be that a number of consecutive occurrences of the first phase difference within a first preset phase difference threshold range reaches a first preset number threshold.

If the first stable condition is satisfied, the first phase detecting unit may be configured to keep the first voltage signal unchanged, so that the first voltage-controlled oscillating unit may output the demodulation reference frequency signal with a fixed frequency according to the first voltage signal.

If the first stable condition is not satisfied, the first phase detecting unit may be configured to receive a new first oscillation frequency signal from the first frequency sampling unit and the local oscillation frequency signal, determine a phase difference between the new first oscillation frequency signal and the local oscillation frequency signal, and use the phase difference between the new first oscillation frequency signal and the local oscillation frequency signal as the first phase difference, wherein the new first oscillation frequency signal may be a signal corresponding to the first voltage signal output by the first voltage-controlled oscillating unit.

That is, the first phase detecting unit, the first voltage-controlled oscillating unit, and the first frequency sampling unit may constitute a frequency feedback system, which may obtain a sampling value from the first voltage-controlled oscillating unit using the first frequency sampling unit, adjust the first voltage signal, and in turn adjust the first oscillation frequency signal output by the first voltage-controlled oscillating unit using the first voltage signal, so as to achieve a stable output with a fixed frequency.

The demodulation reference frequency signal generating sub-module of the wireless radio frequency communication system according to embodiments of the present disclosure may effectively adjust the frequency output by the first voltage-controlled oscillating unit, such that this frequency may be closer to the preset demodulation reference frequency, and improve the stability of the frequency output by the first voltage-controlled oscillating unit, thereby reducing the receiving sensitivity and optimizing the receiving performance. Wherein, the receiving sensitivity may refer to the minimum signal receiving power with which the receiver can correctly demodulate the useful signal.

Continue to referring to FIG. 5, in some embodiments, the transmitting module may comprise a modulating sub-module, a phase locking sub-module, and a power amplifying sub-module, that may be connected sequentially.

Wherein, a first end of the modulating sub-module may connected with the radio frequency controller, a second end of the modulating sub-module may be connected with a first end of the phase locking sub-module, a second end of the phase locking sub-module may be connected with a first end of the power amplifying sub-module, a second end of the power amplifying sub-module may be connected with the port converting device.

The modulating sub-module may be configured to modulate the second baseband signal transmitted by the radio frequency controller to obtain a modulated signal.

The phase locking sub-module may be configured to adjust a frequency of the modulated signal to obtain a target frequency signal.

The power amplifying sub-module may be configured to amplify a power of the target frequency signal to obtain the second differential mode signal.

Wherein, the phase locking sub-module may comprise a second phase detecting unit, a second voltage-controlled oscillating unit, and a second frequency sampling unit.

A first end of the second phase detecting unit may be connected with the modulating sub-module, a second end of the second phase detecting unit may be connected with a first end of the second voltage-controlled oscillating unit, a second end of the second voltage-controlled oscillating unit may be connected with the power amplifying sub-module, a first end of the second frequency sampling unit may be connected with the second phase detecting unit, a the second end of the second frequency sampling unit may be connected with a second end of the second voltage-controlled oscillating unit.

In one embodiment, the second phase detecting unit may be configured to receive a modulated signal from the modulating sub-module and a second oscillation frequency signal from the second frequency sampling unit, determine a second phase difference between the modulated signal and the second oscillation frequency signal, and output a second voltage signal corresponding to the second phase difference.

The second phase detecting unit may be further configured to determine whether the second phase difference satisfies a second stable condition, and the second stable condition nay be that a number of consecutive occurrences of the second phase difference within a second preset phase difference threshold range reaches a second preset number threshold.

If the second stable condition is satisfied, the second phase detecting unit may be configured to keep the second voltage signal unchanged, so that the second voltage-controlled oscillating unit may output the target frequency signal with a fixed frequency according to the second voltage signal.

If the second stable condition is not satisfied, the second phase detecting unit may be configured to receive a new second oscillation frequency signal from the second frequency sampling unit and the modulated signal, determine a phase difference between the new second oscillation frequency signal and the modulated signal, and use the phase difference between the new second oscillation frequency signal and the modulated signal as the second phase difference, wherein the new second oscillation frequency signal may be a signal corresponding to the second voltage signal output by the second voltage-controlled oscillating unit.

That is, the second phase detecting unit, the second voltage-controlled oscillating unit, and the second frequency sampling unit may also constitute a frequency feedback system, which may obtain a sampling value from the second voltage-controlled oscillating unit using the second frequency sampling unit, adjust the second voltage signal, and in turn adjust the second oscillation frequency signal output by the second voltage-controlled oscillating unit using the second voltage signal, until the second voltage-controlled oscillating unit may output a stable target frequency signal.

The phase locking sub-module in the wireless radio frequency communication system according to embodiments of the present disclosure may effectively adjust the frequency output by the second voltage-controlled oscillating unit, such that the target frequency signal output by the second voltage-controlled oscillating unit may be closer to the preset frequency, and the stability of the target frequency signal may be guaranteed, thereby reducing stray radiations.

Figure 6:
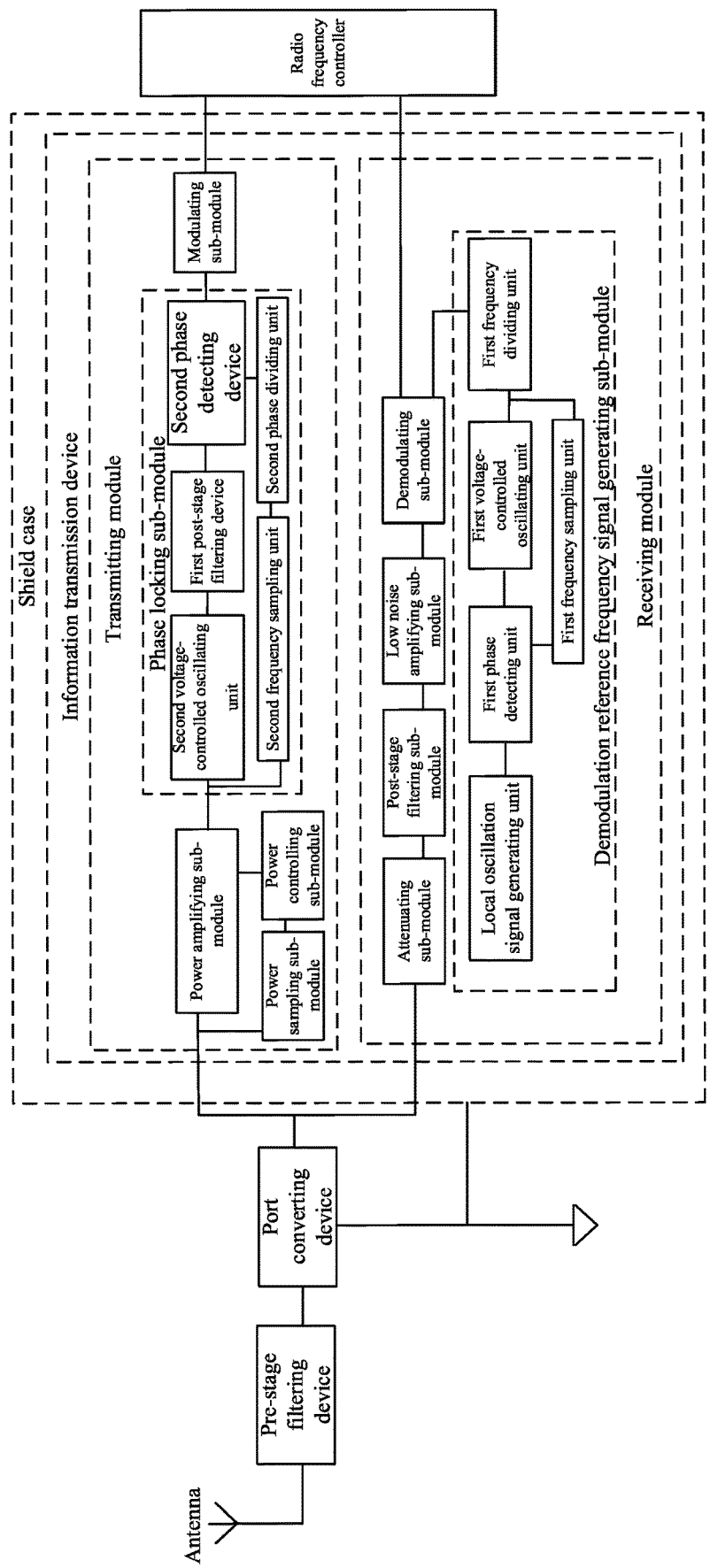
FIG. 6 shows a structural diagram of a wireless radio frequency communication system according to a sixth embodiment of the present disclosure.

FIG. 6 shows a structural diagram of a wireless radio frequency communication system according to yet another embodiment of the present disclosure. The wireless radio frequency communication system as shown in FIG. 6 may differ from the wireless radio frequency communication system as shown in FIG. 5 in that:

As shown in FIG. 6, in some embodiments, the transmitting module may further comprise a power controlling sub-module and a power sampling sub-module.

Wherein, a first end of the power controlling sub-module may be connected with the power amplifying sub-module, a second end of the power controlling sub-module may be connected with a first end of the power sampling sub-module, a second end of the power sampling sub-module may be connected with the power amplifying sub-module.

And wherein, the power controlling sub-module may be configured to receive, via the power sampling sub-module, a power amplified signal from the power amplifying sub-module, and determine whether a difference between a preset power and a power of the power amplified signal belongs to a preset power threshold range.

If the difference belongs to the preset power threshold range, the power controlling sub-module may output a first gain controlling signal, so that the power amplifying sub-module may output the second differential mode signal according to the first gain controlling signal.

In one embodiment, if the difference between the preset power and the power of the power amplified signal is within the preset power threshold range, i.e., the values of the preset power and the power of the power amplified signal are approximately equal, the power controlling sub-module may output the first gain controlling signal. The power amplifying sub-module may receive the first gain controlling signal, and adjust the gain of the power amplifying sub-module to 1, i.e., the power amplifying sub-module may output the second differential mode signal that is close to the preset power.

If the power controlling sub-module determines that the difference between the preset power and the power of the power amplified signal is large, i.e., this difference does not belong to the preset power threshold range, the power controlling sub-module may be configured to output a second gain controlling signal according this difference. The power amplifying sub-module may adjust the gain according to the acquired second gain controlling signal, and output a new power amplified signal according to the adjusted gain.

The wireless radio frequency communication system according to embodiments of the present disclosure, through making the power output via the power amplifying sub-module to be closer to the preset power using the power feedback system composed of the power controlling sub-module, the power sampling sub-module and the power amplifying sub-module, may effectively reduce leakage of signal power on adjacent channels, thereby reducing an adjacent channel leakage ratio.

Continue to referring to FIG. 6, in some embodiments, the receiving module may further comprise an attenuating sub-module, a first end of the attenuating sub-module may be connected with the port converting device, and a second end of the attenuating sub-module may be connected with the post-stage filtering sub-module.

Wherein, the attenuating sub-module may be configured to attenuate the power of the first differential mode signal output by the port converting device to cause the power of the first differential mode signal to satisfy the power requirement of the post-stage filtering sub-module.

In some embodiments, the demodulation reference frequency signal generating sub-module may further comprise a first frequency dividing unit, a first end of the first frequency dividing unit may be connected with the first voltage-controlled oscillating unit, and a second end of the first frequency dividing unit may be connected with the demodulation sub-module.

Wherein, the first frequency dividing unit may be configured to adjust the frequency of the frequency signal output by the first voltage-controlled oscillating unit using a first frequency adjusting factor, so as to adjust the frequency output by the first voltage-controlled oscillating unit according to the actual requirement of the demodulation reference frequency signal.

In some embodiments, the phase locking sub-module may further comprise a second frequency dividing unit, a first end of the second frequency dividing unit may be connected with the second frequency sampling unit, and a second end of the second frequency dividing unit may be connected with the second phase detecting unit, the second frequency dividing unit may be configured to adjust the frequency of the frequency signal collected by the second frequency sampling unit using a second frequency adjusting factor, so as to adjust the frequency output by the second voltage-controlled oscillating unit according to the actual requirement of the preset frequency.

Figure 7:
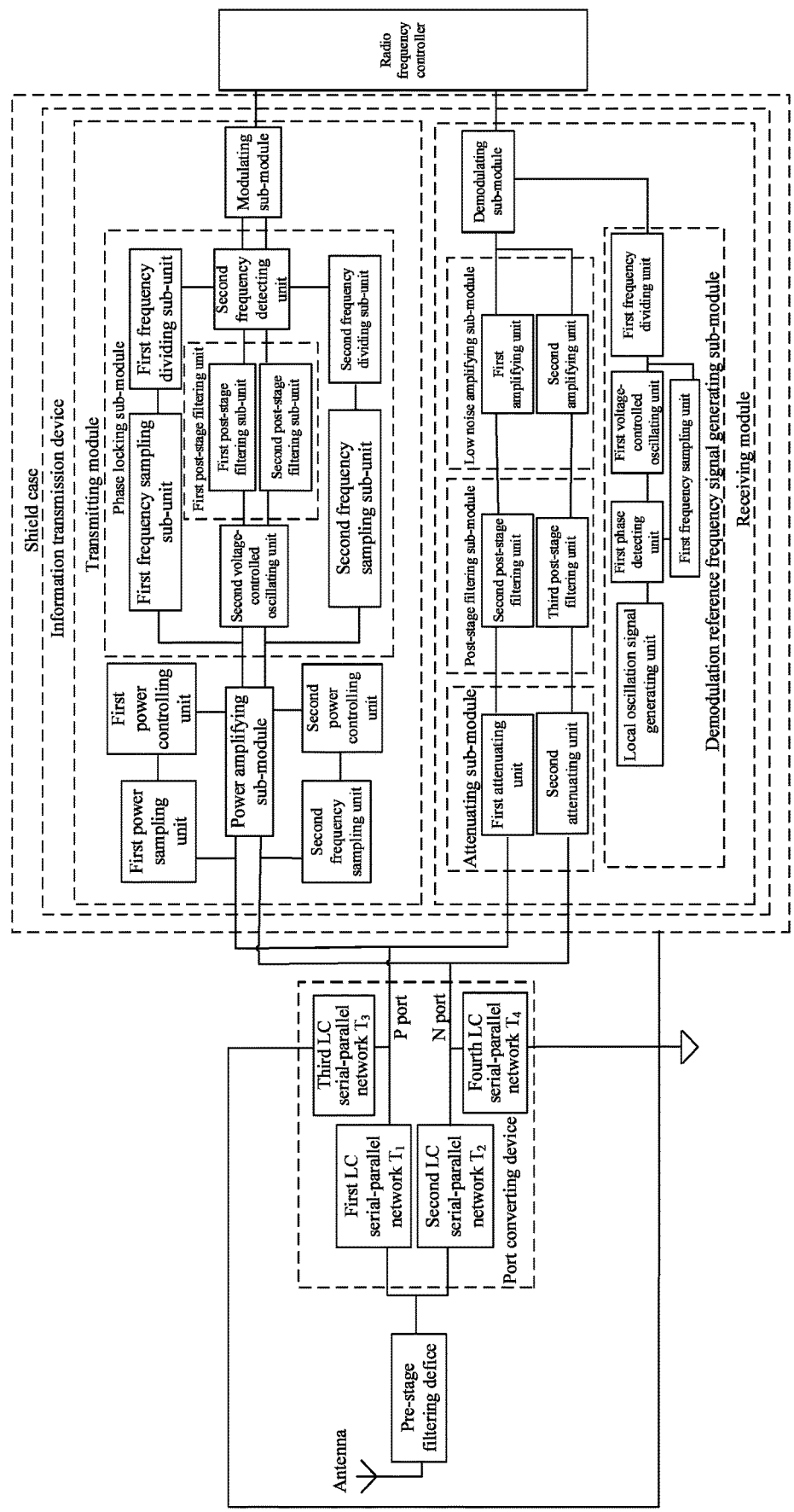
FIG. 7 shows a structural diagram of a wireless radio frequency communication system according to a seventh embodiment of the present disclosure.

FIG. 7 shows a structural diagram of a wireless radio frequency communication system according to yet another embodiment of the present disclosure. FIG. 7 schematically shows the specific structure of the receiving module and the transmitting module.

As shown in FIG. 7, in the receiving module, the attenuating sub-module may comprise a first attenuating unit and a second attenuating unit; the post-stage filtering sub-module may comprise a second post-stage filtering unit and a third post-stage filtering unit; and the low noise amplifying sub-module may comprise a first amplifying unit and a second amplifying unit.

Wherein, a first end of the first attenuating unit may be connected with the P port of the port converting device, a second end of the first attenuating unit may be connected with a first end of the second post-stage filtering unit; a second end of the second post-stage filtering unit may be connected with a first end of the first amplifying unit, a second end of the first amplifying unit may be connected with the demodulating sub-module.

A first end of the second attenuating unit may be connected with the N port of the port converting device, a second end of the second attenuating unit may be connected with a first end of the third post-stage filtering unit, a second end of the third post-stage filtering unit may be connected with a first end of the second amplifying unit, a second end of the second amplifying unit may be connected with the demodulating sub-module.

In one embodiment, if the radio frequency controller controls the P port to connect with the first end of the first attenuating unit, and the N port to connect with the first end of the second attenuating unit, the wireless communication radio frequency system will receive information from the outside through the receiving module. The working process of receiving information by the wireless radio frequency communication system will be given below:

First, the antenna may convert the received radio frequency signal into a single-ended signal. The pre-stage filtering device may filter the single-ended signal output by the antenna. The port converting device may convert the filtered single-ended signal into an RX-P signal output from the P port and an RX-N signal output from the N port. Wherein, the RX-P signal and the RX-N signal may be first differential mode signals of the same amplitude and opposite phases.

Then, the first attenuating unit may receive the RX-P signal and attenuate the power of the RX-P signal. The second post-stage filtering unit may filter the attenuated RX-P signal to filter out interference signals. The first amplifying unit may amplify the filtered RX-P signal.

The second attenuating unit may receive the RX-N signal and attenuates the power of the RX-N signal. The third post-stage filtering unit may filter the attenuated RX-N signal to filter out interference signals. The second amplifying unit may amplify the filtered RX-N signal.

Finally, the demodulating sub-module may demodulate the amplified RX-P signal and the amplified RX-N signal based on the demodulation reference frequency signal to obtain the first baseband signal, and transmits the first baseband signal to the radio frequency controller to enable the radio frequency controller to process the first baseb and signal.

In some embodiments, the first attenuating unit and the second attenuating unit may be integrated. As an example, both the first attenuating unit and the second attenuating unit may be external circuits, and the first attenuating unit and the second attenuating unit may be integrated into one chip by using an integrated circuit process, to reduce the size of the wireless radio frequency communication system and reduce the cost of the wireless radio frequency communication system.

Similarly, the second post-stage filtering unit and the third post-stage filtering unit may also be integrated; the first amplifying unit and the second amplifying unit may also be integrated, to reduce the cost of the wireless radio frequency communication system.

In one embodiment, the first attenuating unit, the second attenuating unit, the second post-stage filtering unit, the third post-stage filtering unit, the first amplifying unit, and the second amplifying unit may also be integrated onto one chip.

In the transmitting module of this embodiment, the power sampling sub-module may comprise a first power sampling unit and a second power sampling unit; the power control sub-module may comprise a first power controlling unit and a second power controlling unit; the second frequency sampling unit may comprise a frequency sampling sub-unit and a second frequency sampling sub-unit; the second frequency dividing unit may comprise a first frequency dividing sub-unit and a second frequency dividing sub-unit; the first post-stage filtering unit comprises a first post-stage filtering sub-unit and a second post-stage filtering sub-unit.

Wherein, a first input end of the second phase detecting unit may be connected with a first output end of the modulating sub-module, a second input end of the second phase detecting unit may be connected with a second output end of the modulating sub-module; a first output end of the second phase detecting unit may be connected with a first end of the first post-stage filtering sub-unit, a second end of the first post-stage filtering sub-unit may be connected with a first input end of the second voltage-controlled oscillating unit; a second output end of the second phase detecting unit may be connected with a first end of the second post-stage filtering sub-unit, a second end of the second post-stage filtering sub-unit may be connected with a second input end of the second voltage-controlled oscillating unit.

A first end of the first frequency dividing sub-unit may be connected with a first end of the first frequency sampling sub-unit, a second end of the first frequency dividing sub-unit may be connected with a second phase detecting unit; a second end of the first frequency sampling sub-unit may be connected with a first output end of the second voltage-controlled oscillating unit.

A first end of the second frequency dividing sub-unit may be connected with a first end of the second frequency sampling sub-unit, a second end of the second frequency dividing sub-unit may be connected with the second phase detecting unit; a second end of the second frequency sampling sub-unit may be connected with a second output end of the second voltage-controlled oscillating unit.

A first input end of the power amplifying sub-module may be connected with a first output end of the second voltage-controlled oscillating unit, a second input end of the power amplifying sub-module may be connected with a second output end of the second voltage-controlled oscillating unit; a first end of the first power controlling unit may be connected with the power amplifying sub-module, a second end of the first power controlling unit may be connected with a first end of the first power sampling unit, a second end of the first power sampling unit may be connected with a first output end of the power amplifying sub-module, and a first output end of the power amplifying sub-module may connected with the P port.

A first end of the second power controlling unit may be connected with the power amplifying sub-module, a second end of the second power controlling unit may be connected with a first end of the second power sampling unit, a second end of the second power sampling unit may be connected with a second output end of the power amplifying module, and a second output end of the power amplifying sub-module may be connected with the N port.

In one embodiment, if the radio frequency controller controls the P port to connect with the first output end of the power amplifying sub-module, and the N port to connect with the second output end of the power amplifying sub-module, the wireless communication radio frequency system may transmit information to the outside through the transmitting module. The working process of transmitting information by the wireless radio frequency communication system will be given below:

The radio frequency controller may output the second baseband signal to be transmitted to the modulating sub-module. The modulating sub-module may modulate the second baseband signal, and output a first modulated sub-signal through the first output end and a second modulated sub-signal through the second output end. Wherein, the first modulated sub-signal and the second modulated sub-signal may be two signals of the same voltage amplitude and opposite phases.

The first input end of the second phase detecting unit may receive the first modulated sub-signal from the modulating sub-module and a first frequency-divided signal from the first frequency dividing sub-unit. Wherein, the first frequency-divided signal may be a signal obtained after performing, by the first frequency dividing sub-unit, a frequency adjusting on a first oscillation frequency sub-signal collected by the first frequency sampling sub-unit from the first output end of the second voltage-controlled oscillating unit. The second phase detecting unit may determine a first sub-phase difference between the first modulated sub-signal and the first frequency-divided signal, and output a first voltage sub-signal corresponding to the first sub-phase difference.

The second phase detecting unit may determine whether the first sub-phase difference satisfy a third stable condition, and the third stable condition may be that a number of consecutive occurrences of the first sub-phase difference within a third preset phase difference threshold range reaches a third preset number threshold.

If the third stable condition is satisfied, the second phase detecting unit may keep the first voltage sub-signal unchanged, and the first post-stage filtering sub-unit may filter the first voltage sub-signal. The second voltage-controlled oscillating unit may output a first target frequency sub-signal with a fixed frequency according to the filtered first voltage sub-signal.

If the third stable condition is not satisfied, the second voltage-controlled oscillating unit may output a new first oscillation frequency sub-signal corresponding to the first voltage sub-signal according to the filtered first voltage sub-signal. The first frequency sampling sub-unit may sample the new first oscillation frequency sub-signal and feed it to the first frequency dividing sub-unit. The first frequency dividing sub-unit may perform a frequency division on the new first oscillation frequency sub-signal to obtain a new first frequency-divided signal.

The second phase detecting unit may receive the new first frequency-divided signal and the first modulated sub-signal, determine a new first sub-phase difference between the first modulated sub-signal and the new first frequency-divided signal, and output a new first voltage sub-signal corresponding to the new first sub-phase difference.

That is, the second phase detecting unit, the first post-stage filtering sub-unit, the second voltage-controlled oscillating unit, the first frequency sampling sub-unit, and the first frequency dividing sub-unit may constitute a feedback system. The feedback system may continuously repeat the above process, until the new first sub-phase difference satisfies the third stable condition, then the second phase detecting unit may keep the new first voltage sub-signal unchanged, and the first post-stage filtering sub-unit may filter the new first voltage sub-signal. The second voltage-controlled oscillating unit may output the first target frequency sub-signal with a fixed frequency according to the filtered new first voltage sub-signal.

The first input end of the power amplifying sub-module may receive the first target frequency sub-signal, amplify the first target frequency sub-signal, and output a first power amplified sub-signal from the first output end. The first power sampling sub-unit may sample the first power amplified sub-signal and feed the sampled first power amplified sub-signal to the first power controlling sub-unit.

The power controlling sub-module may receive the first power amplified sub-signal from the power amplifying sub-module, and determine whether a difference between the preset power and the power of the first power amplified sub-signal is within the preset power threshold range;

If the difference belongs to the preset power threshold range, the power controlling sub-module may output a first gain controlling sub-signal, such that the power amplifying sub-module may output a TX-P signal whose power may be close to the preset power according to the first gain controlling sub-signal.

If the difference does not belong to the preset power threshold range, the power controlling sub-module may be configured to output a second gain controlling sub-signal, such that the power amplifying sub-module may output a new first power amplified sub-signal according to the second gain controlling sub-signal.

The power amplifying sub-module, the first power controlling sub-unit and the first power sampling sub-unit may form a power feedback system. The feedback system may continuously repeat the above process, until the difference between the new first power amplified sub-signal and the preset power belongs to the preset power threshold range, such that the power amplifying sub-module may output a TX-P signal whose power may be close to the preset power. The power amplifying sub-module may input the TX-P signal to the P port.

While the first input end of the second phase detecting unit receives the first modulated sub-signal, the second input end of the second phase detecting unit may receive the second modulated sub-signal from the modulating sub-module, and a second frequency-divided signal from the second frequency dividing sub-unit. Wherein, the second frequency-divided signal may be a signal obtained after performing, by the second frequency dividing sub-unit, a frequency adjusting on a second oscillation frequency sub-signal collected by the second frequency sampling sub-unit from the second output end of the second voltage-controlled oscillating unit. The second phase detecting unit may determine a second sub-phase difference between the second modulated sub-signal and the second frequency-divided signal, and output a second voltage sub-signal corresponding to the second sub-phase difference.

The second phase detecting unit may determine whether the second sub-phase difference satisfy a fourth stable condition, and the fourth stable condition may be that a number of consecutive occurrences of the second sub-phase difference within a fourth preset phase difference threshold range reaches a fourth preset number threshold.

If the above fourth stable condition is satisfied, the second phase detecting unit may keep the second voltage sub-signal unchanged, and the second post-stage filtering sub-unit may filter the second voltage sub-signal. The second voltage-controlled oscillating unit may output a second target frequency sub-signal with a fixed frequency according to the filtered second voltage sub-signal.

If the fourth stable condition is not satisfied, the second voltage-controlled oscillating unit may output a new second oscillation frequency sub-signal corresponding to the second voltage sub-signal according to the filtered second voltage sub-signal. The second frequency sampling sub-unit may sample the new second oscillation frequency sub-signal and feed it to the second frequency dividing sub-unit. The second frequency dividing sub-unit may perform a frequency division on the new second oscillation frequency sub-signal to obtain a new second frequency-divided signal. The second phase detecting unit may receive the new second frequency-divided signal and the second modulated sub-signal, determine a new second sub-phase difference between the second modulated sub-signal and the new second frequency-divided signal, and output a new second voltage sub-signal corresponding to the new second sub-phase difference.

That is, the second phase detecting unit, the second post-stage filtering sub-unit, the second voltage-controlled oscillating unit, the second frequency sampling sub-unit, and the second frequency dividing sub-unit may also constitute a feedback system. The feedback system may continuously repeat the above process, until the new second sub-phase difference satisfies the above third stable condition, then the second phase detecting unit may keep the new second voltage sub-signal unchanged, and the second post-stage filtering sub-unit may filter the new second voltage sub-signal. The second voltage-controlled oscillating unit may output the second target frequency sub-signal with a fixed frequency according to the filtered new second voltage sub-signal.

The second input end of the power amplifying sub-module may receive the second target frequency sub-signal, amplify the second target frequency sub-signal, and output a second power amplified sub-signal from the second output end. The second power sampling sub-unit may sample the second power amplified sub-signal and feed the sampled second power amplified sub-signal to the second power controlling sub-unit.

The power controlling sub-module may receive the second power amplified sub-signal from the power amplifying sub-module, and determine whether a difference between the preset power and the power of the second power amplified sub-signal is within the preset power threshold range;

If the difference belongs to the preset power threshold range, the power controlling sub-module may output a third gain controlling sub-signal, such that the power amplifying sub-module may output a TX-N signal whose power may be close to the preset power according to the third gain controlling sub-signal.

If the difference does not belong to the preset power threshold range, the power controlling sub-module may be configured to output a fourth gain controlling sub-signal, such that the power amplifying sub-module may output a new second power amplified sub-signal according to the fourth gain controlling sub-signal.

The power amplifying sub-module, the second power controlling sub-unit and the second power sampling sub-unit may form a power feedback system. The feedback system may continuously repeat the above process, until the difference between the new second power amplified sub-signal and the preset power belongs to the preset power threshold range, then the power amplifying sub-module may output a TX-N signal. The power amplifying sub-module may input the TX-N signal to the N port. Wherein, the TX-N signal and the TX-P signal may be second differential mode signals of the same amplitude and opposite phases.

The port converting device may convert the second differential mode signal into a single-ended signal and input the single-ended signal to the pre-stage filtering device. The antenna may convert the single-ended signal filtered by the pre-stage filtering device into a radio frequency signal, and transmit the radio frequency signal.

In one embodiment, similarly, the first power sampling unit and the second power sampling unit may also be integrated; the first power controlling unit and the second power controlling unit may also be integrated; the first frequency sampling sub-unit and the second frequency sampling sub-unit may also be integrated; the first frequency dividing sub-unit and the second frequency dividing sub-unit may also be integrated; the first post-stage filtering sub-unit and the second post-stage filtering sub-unit may also be integrated, so as to greatly reducing the cost of the wireless radio frequency communication system.

The wireless radio frequency communication system of FIG. 7 may be applied to a variety of scenarios. For example, the wireless radio communication system may be applied to a battery management system. As an example, the battery management system may comprise a battery monitoring unit and a battery controlling unit. Wherein, both the battery monitoring unit and the battery controlling unit may comprise the wireless radio frequency communication system as shown in FIG. 7 for performing wireless radio frequency communication.

The battery monitoring unit may be configured to monitor status of the battery, including information such as a battery voltage, a temperature, a fault status, etc. The battery monitoring unit may transmit the monitored information such as battery voltage, temperature, fault status and the like to the battery controlling unit through the wireless radio frequency communication system. The battery controlling unit may receive information from the battery monitoring unit and transmit information such as codes and battery equalization to the battery monitoring unit.

The wireless radio frequency communication system according to embodiment of the present disclosure may not only avoid external interferences using the high-performance port converting device and the shield case disposed on the information transmission device, but also reduce reception sensitivity or reduce stray radiation by the pre-stage filtering device and the post-stage filtering unit, moreover, the wireless radio frequency communication system may also reduce reception sensitivity or reduce adjacent channel leakage ratio by the frequency feedback system and power feedback system, thus the performance of the wireless radio communication system may be further improved.

What aforementioned are merely specific embodiments of the present disclosure, and those skilled in the art can clearly understand that, for the convenience and brevity of the description, the specific working processes of the system, module and unit described above may refer to the corresponding processes of the foregoing method embodiments, which will not be repeated herein. It should be understood that the protection scope of the present disclosure is not limited thereto, and various equivalent modifications or substitutions may be easily conceived by those skilled in the art within the scope of the present disclosure, and these modifications or substitutions fall within the scope of the present disclosure.

What is claimed is:

1. A wireless radio frequency communication system, comprising: an antenna, a port converting device, an information transmission device, a shield case, and a reference voltage end; wherein:
   the antenna, the port converting device, and the information transmission device are connected sequentially, the information transmission device is disposed within the shield case, and both the shield case and the port converting device are connected with the reference voltage end;
   the antenna is configured for a conversion between a radio frequency signal and a single-ended signal;
   the port converting device is configured for a conversion between the single-ended signal and a target differential mode signal;
   the information transmission device is configured to transmit and process the target differential mode signal; and
   parameters of components in the port converting device are determined according to a preset communication frequency, and a voltage amplitude and phase of the target differential mode signal.

2. The system of claim 1, wherein the port converting device comprises a first inductor $L_1$, a second inductor $L_2$, a first capacitor $C_1$, and a second capacitor $C_2$; wherein
   a first end of the first inductor $L_1$ is connected with a first end of the second capacitor $C_2$, a second end of the first inductor $L_1$ is connected with a first end of the first capacitor $C_1$, a second end of the second capacitor $C_2$ is connected with a first end of the second inductor $L_2$, and a second end of the first capacitor $C_1$ and a second end of the second inductor $L_2$ are connected with the reference voltage end; and
   an inductance value of the first inductor $L_1$, an inductance value of the second inductor $L_2$, an capacitance value of the first capacitor $C_1$, and an capacitance value of the second capacitor $C_2$ are determined according to a voltage amplitude and phase of an output signal of the second end of the first inductor $L_1$, as well as a voltage amplitude and phase of an output signal of the second end of the second capacitor $C_2$.

3. The system of claim 1, wherein the port converting device comprises a first LC serial-parallel network $T_1$, a second LC serial-parallel network $T_2$, a third LC serial-parallel network $T_3$, and a fourth LC serial-parallel network $T_4$; wherein
a first end of the $T_1$ is connected with a first end of the $T_2$, a second end of the $T_1$ is connected with a first end of the $T_3$, a second end of the $T_2$ is connected with a first end of the $T_4$, and a second end of the $T_3$ and a second end of the $T_4$ are connected with the reference voltage end;
the $T_1$ comprises at least one third inductor, and the $T_2$ comprises at least one third capacitor; and
the $T_3$ comprises at least one fourth capacitor, and the $T_4$ comprises at least one fourth inductor.

4. The system of claim 1, wherein the shield case is a metal case.

5. The system of claim 1, wherein the system further comprises: a pre-stage filtering device;
a first end of the pre-stage filtering device is connected with the antenna, and a second end of the pre-stage filtering device is connected with the port converting device; and
the pre-stage filtering device is configured to filter the single-ended signal.

6. The system of claim 1, wherein the information transmission device comprises a transmitting module and a receiving module;
the receiving module is connected with the port converting device, and configured to receive a first differential mode signal from the port converting device and convert the first differential mode signal into a first baseband signal; and
the transmitting module is connected with the port converting device, and configured to receive a second baseband signal, convert the second baseband signal into a second differential mode signal, and input the second differential mode signal to the port converting device.

7. The system of claim 6, wherein the system further comprises: a radio frequency controller connected with the information transmission device;
the radio frequency controller is configured to output the second baseband signal and control the transmitting module to output the second differential mode signal; and
the radio frequency controller is further configured to receive the first baseband signal and control the receiving module to receive the first differential mode signal.

8. The system of claim 7, wherein the receiving module comprises: a post-stage filtering sub-module, a low-noise amplifying sub-module, a demodulating sub-module, and a demodulation reference frequency signal generating sub-module that are connected sequentially,
a first end of the post-stage filtering sub-module is connected with the port converting device, a second end of the post-stage filtering sub-module is connected with a first end of the low-noise amplifying sub-module, a second end of the low-noise amplifying sub-module is connected with a first end of the demodulating sub-module, and a second end of the demodulating sub-module is connected with the radio frequency controller;
the post-stage filtering sub-module is configured to filter the first differential mode signal;
the low-noise amplifying sub-module is configured to perform a signal amplification on the filtered first differential mode signal to obtain a first amplified differential mode signal;
the demodulating sub-module is configured to demodulate the first amplified differential mode signal based on a received demodulation reference frequency signal to obtain the first baseband signal;
the demodulation reference frequency signal generating sub-module is configured to generate the demodulation reference frequency signal.

9. The system of claim 8, wherein the demodulation reference frequency signal generating sub-module comprises: a local oscillation signal generating unit, a first phase detecting unit, a first voltage-controlled oscillating unit, and a first frequency sampling unit; wherein
the local oscillation signal generating unit is connected with a first end of the first phase detecting unit, a second end of the first phase detecting unit is connected with a first end of the first voltage-controlled oscillating unit, a second end of the first voltage-controlled oscillating unit is connected with the demodulating sub-module, a first end of the first frequency sampling unit is connected with the first phase detecting unit, and a second end of the first frequency sampling unit is connected with a second end of the first voltage-controlled oscillating unit;
the first phase detecting unit is configured to receive a local oscillation frequency signal from the local oscillation signal generating unit and a first oscillation frequency signal from the first frequency sampling unit, determine a first phase difference between the local oscillation frequency signal and the first oscillation frequency signal, and output a first voltage signal corresponding to the first phase difference;
the first phase detecting unit is further configured to determine whether the first phase difference satisfies a first stable condition, wherein the first stable condition is that a number of consecutive occurrences of the first phase difference within a first preset phase difference threshold range reaches a first preset number threshold;
if the first stable condition is satisfied, the first phase detecting unit is configured to keep the first voltage signal unchanged, so that the first voltage-controlled oscillating unit outputs the demodulation reference frequency signal with a fixed frequency according to the first voltage signal; and
if the first stable condition is not satisfied, the first phase detecting unit is configured to receive a new first oscillation frequency signal from the first frequency sampling unit and the local oscillation frequency signal, determine a phase difference between the new first oscillation frequency signal and the local oscillation frequency signal, and use the phase difference between the new first oscillation frequency signal and the local oscillation frequency signal as the first phase difference, wherein the new first oscillation frequency signal is a signal corresponding to the first voltage signal output by the first voltage-controlled oscillating unit.

10. The system of claim 7, wherein the transmitting module comprises a modulating sub-module, a phase locking sub-module, and a power amplifying sub-module;
a first end of the modulating sub-module is connected with the radio frequency controller, a second end of the modulating sub-module is connected with a first end of the phase locking sub-module, a second end of the phase locking sub-module is connected with a first end of the power amplifying sub-module, and a second end of the power amplifying sub-module is connected with the port converting device; wherein:
the modulating sub-module is configured to modulate the second baseband signal to obtain a modulated signal;
the phase locking sub-module is configured to adjust a frequency of the modulated signal to obtain a target frequency signal; and
the power amplifying sub-module is configured to amplify a power of the target frequency signal to obtain the second differential mode signal.

11. The system of claim 10, wherein the phase locking sub-module comprises a second phase detecting unit, a second voltage-controlled oscillating unit, and a second frequency sampling unit;
a first end of the second phase detecting unit is connected with the modulating sub-module, a second end of the second phase detecting unit is connected with a first end of the second voltage-controlled oscillating unit, a second end of the second voltage-controlled oscillating unit is connected with the power amplifying sub-module, a first end of the second frequency sampling unit is connected with the second phase detecting unit, and a the second end of the second frequency sampling unit is connected with a second end of the second voltage-controlled oscillating unit;
the second phase detecting unit is configured to receive the modulated signal from the modulating sub-module and a second oscillation frequency signal from the second frequency sampling unit, determine a second phase difference between the modulated signal and the second oscillation frequency signal, and output a second voltage signal corresponding to the second phase difference;
the second phase detecting unit is further configured to determine whether the second phase difference satisfies a second stable condition, and the second stable condition is that a number of consecutive occurrences of the second phase difference within a second preset phase difference threshold range reaches a second preset number threshold;
if the second stable condition is satisfied, the second phase detecting unit is configured to keep the second voltage signal unchanged, so that the second voltage-controlled oscillating outputs the target frequency signal with a fixed frequency according to the second voltage signal; and
if the second stable condition is not satisfied, the second phase detecting unit is configured to receive a new second oscillation frequency signal from the second frequency sampling unit and the modulated signal, determine a phase difference between the new second oscillation frequency signal and the modulated signal, and use the phase difference between the new second oscillation frequency signal and the modulated signal as the second phase difference, wherein the new second oscillation frequency signal is a signal corresponding to the second voltage signal output by the second voltage-controlled oscillating unit.

12. The system of claim 10, wherein the phase locking sub-module further comprises a first post-stage filtering unit;
a first end of the first post-stage filtering unit is connected with a second end of the second phase detecting unit, and a second end of the first post-stage filtering unit is connected with a first end of the second voltage-controlled oscillating unit; and
the first post-stage filtering unit is configured to filter the second voltage signal, and input the filtered second voltage signal to the second voltage-controlled oscillating unit.

13. The system of claim 10, wherein the transmitting module further comprises a power controlling sub-module and a power sampling sub-module;
a first end of the power controlling sub-module is connected with the power amplifying sub-module, a second end of the power controlling sub-module is connected with a first end of the power sampling sub-module, and a second end of the power sampling sub-module is connected with the second end of the power amplifying sub-module;
the power controlling sub-module is configured to receive, via the power sampling sub-module, a power amplified signal from the power amplifying sub-module, and determine whether a difference between a preset power and a power of the power amplified signal belongs to a preset power threshold range;
if the difference belongs to the preset power threshold range, the power controlling sub-module outputs a first gain controlling signal, so that the power amplifying sub-module outputs the second differential mode signal according to the first gain controlling signal;
if the difference does not belong to the preset power threshold range, the power controlling sub-module is configured to output a second gain controlling signal, so that the power amplifying sub-module outputs a new power amplified signal according to the second gain controlling signal.

* * * * *